United States Patent [19]

Busschaert et al.

[11] Patent Number: 5,331,665
[45] Date of Patent: Jul. 19, 1994

[54] DECODER DEVICE FOR DECODING CONVOLUTIONALLY ENCODED MESSAGE

[75] Inventors: Hans J. J. Busschaert, Waasmunster; Peter P. F. Reusens, Laarne; Ronny M. A. Van Camp, Lint, all of Belgium

[73] Assignee: Alcatel N.V., Netherlands

[21] Appl. No.: 878,731

[22] Filed: May 5, 1992

[30] Foreign Application Priority Data

May 8, 1991 [BE] Belgium ................................ 9100432

[51] Int. Cl.$^5$ ...................... H03D 1/00; H04L 27/06; G06F 11/10; H03M 13/12
[52] U.S. Cl. ........................................ 375/94; 371/43
[58] Field of Search ................ 371/43, 45, 44; 375/94

[56] References Cited

U.S. PATENT DOCUMENTS

| 4,536,878 | 8/1985 | Rattlingourd et al. ............... 371/43 |
| 4,742,533 | 5/1988 | Weidner et al. ....................... 375/85 |
| 4,811,346 | 3/1989 | Battail . | |

FOREIGN PATENT DOCUMENTS 0210932  7/1986  European Pat. Off. .
0234558  2/1987  European Pat. Off. .

OTHER PUBLICATIONS

"A Bit Serial Viterbi Decoder Chip for the Mbit/s Range", Stahl et al., *Proceedings of the IEEE 1987, Custom Integrated Circuits Conference*, May 7, 1987, Portland Oreg., pp. 551, 554.

"Architectural Design and Realization of a Single-Chip Viterbi Decoder", Biver et al., *Integration the VLSI Journal*, Oct. 1989, Amsterdam, pp. 3-16.

"A Bit-Serial Architecture for a VLSI Viterbi Processor", M. Bree et al., *Conference Proceedings, WES-CANEX 88, Digital Communications*, May 12, 1988, Saskatoon, Saskatchewan, Canada, pp. 72-77.

G. Fettweis et al., "Parallel Algorithm Implementation Breaking the ACS-Bottleneck," Aug. 1989, 785-789, IEEE Trans. on Comm., vol. 37 No. 8.

S. Meier, "A Viterbi Decoder Architecture Based on Parallel Processing Elements", Dec. 1990, 1323-1327, Globecom 1990.

*Primary Examiner*—Curtis Kuntz
*Assistant Examiner*—Duane Kobayashi
*Attorney, Agent, or Firm*—Ware, Fressola, Van Der Sluys & Adolphson

[57] ABSTRACT

A decoder device (VD) used for decoding digital messages according to the Viterbi convolutional decoding algorithm. This Viterbi decoder (VD) may be integrated in a portion of a single electronic chip for inclusion in a receiver of a handportable mobile station of a digital cellular radio system. The decoder (VD) includes a first module (VITALFA) to calculate transition probabilities for the possible state transitions between two successive states of the decoder, and a second module (VIPROB) to calculate, as a function of the state transition probabilities, path probabilities for the possible paths constituted by successive state transitions and ending in each of these states, and to select the path having the highest path probability value. The first-/second module (VITALFA/VIPROB) of the device (VD) further calculates a state transition/path bit error rate which is function of the difference between the bits (softbits) received in the first module (VITALFA) and the bits (coded bits) expected for a same state transition/path respectively.

10 Claims, 10 Drawing Sheets

| FIG. 1A | FIG. 1B |

FIG. 1

| FIG. 6A |
| FIG. 6B |

CONVOLUTIONAL ENCODER (CE)

DECODER DEVICE FOR DECODING CONVOLUTIONALLY ENCODED MESSAGE

TECHNICAL FIELD

The present invention relates to a decoder device using the Viterbi algorithm for decoding convolutionally encoded messages.

BACKGROUND OF THE INVENTION

The Viterbi decoding algorithm is an optimal and widely used forward- error- correction technique for removing noise from digital radio signals. However, its implementation in hardware is complex and expensive so that the use of a multipurpose microprocessor is generally preferred over a dedicated device. This is for instance the case for the decoder device disclosed in the article "Realtime implementation of the Viterbi decoding algorithm on a high-performance microprocessor" by S.M. Said et al, published in the review "Microprocessors and microsystems", vol 10, no 1, January/February 1986, pages 11 to 16. Therein, the Viterbi algorithm is implemented in the circuitry (firmware) of a standard microprocessor MC68000 manufactured by MOTOROLA ®.

A drawback of such a known decoder device is that it is not optimized for performing the Viterbi decoding algorithm. This is particularly true when a high throughput, a small board surface and a low power consumption are required. Indeed, the hardware thereof is designed for handling standard wordlengths, e.g. of 16 bits, and these generally exceed the needs for the specific Viterbi algorithm and thereby increase some delays. Additionally, the microprocessor and its associated memories and peripherals comprise more circuitry than needed for this application, so that both the required board surface and the power consumption are unnecessarily high.

DISCLOSURE OF THE INVENTION

An object of the present invention is to provide a decoder device of the above known type, but which is able to handle high throughput and requires a reduced power consumption and surface.

According to the invention, this object is achieved due to the fact that it includes a first module to calculate transition probabilities for the possible state transitions between two successive states of the decoder, and a second module to calculate, as a function of said transition probabilities, path probabilities for the possible paths constituted by successive state transitions and ending in each of said states, and to select, for each of said states, only the path having the highest path probability value.

This application specific architecture allows the hardware implementation and the length of the words used in the Viterbi algorithm to be optimized. Both the required surface and the power consumption are thereby reduced.

Another problem with the known decoder device is that the performance and, more particularly, the calculation execution time are penalized by the fact that all the calculations are executed in sequence.

A further object of the present invention is to reduce this execution time.

According to the invention, this further object is achieved due to the fact that said first module may include a first control circuit for controlling the operation of said first module, that said second module may include a second control circuit for controlling the operation of said second module, and that said first module may and said second module operate independently from each other, their operation being supervised by a common control module.

In this way, the first module may calculate a transition probability while the second module calculates a path probability. This simultaneity of calculations drastically reduces the calculation execution time of the decoder device.

Another aspect of the present invention is that said decoder device may include a third module to select, amongst said paths selected by said second module, only one path corresponding to the estimated message to be decoded, that said third module may include a third control circuit controlling the operations of said third module, and that said third module may operate independently from said first and said second modules, the operation of all these modules being supervised by said common control module.

Another aspect of the invention is that said first module may further calculate, for each of said state transitions, a transition bit error rate which is function of the difference between the bits (softbits) received in said first module and the bits (coded bits) expected for a same state transition and that said second module may further calculate, for each of said selected paths, a path bit error rate which is the sum of the transition bit error rates of the state transitions constituting said path.

Also another feature of the invention is that said first module may simultaneously calculate, for each state transition, said transition probability and said transition bit error rate and that said second module may calculate, simultaneously and in parallel, said path probability and said path bit error rate, In this way, the decoder device has an enhanced throughout.

The above mentioned and other objects and features of the invention will become more apparent and the invention itself will be best understood by referring to the following description of an embodiment taken in conjunction with the accompanying drawings.

BEST MODE FOR CARRYING OUT THE INVENTION

Figure 1:
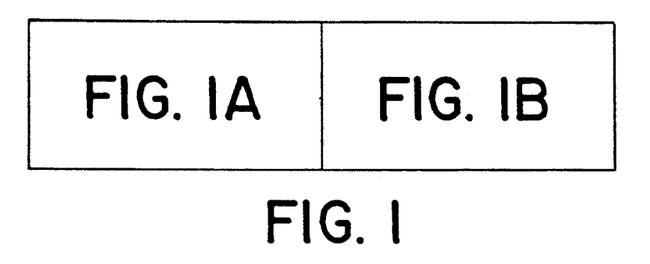
FIG. 1 shows the relation between FIGS. 1A and 1B which together form a block diagram of a Viterbi decoder VD according to the invention.
Figure 1A:
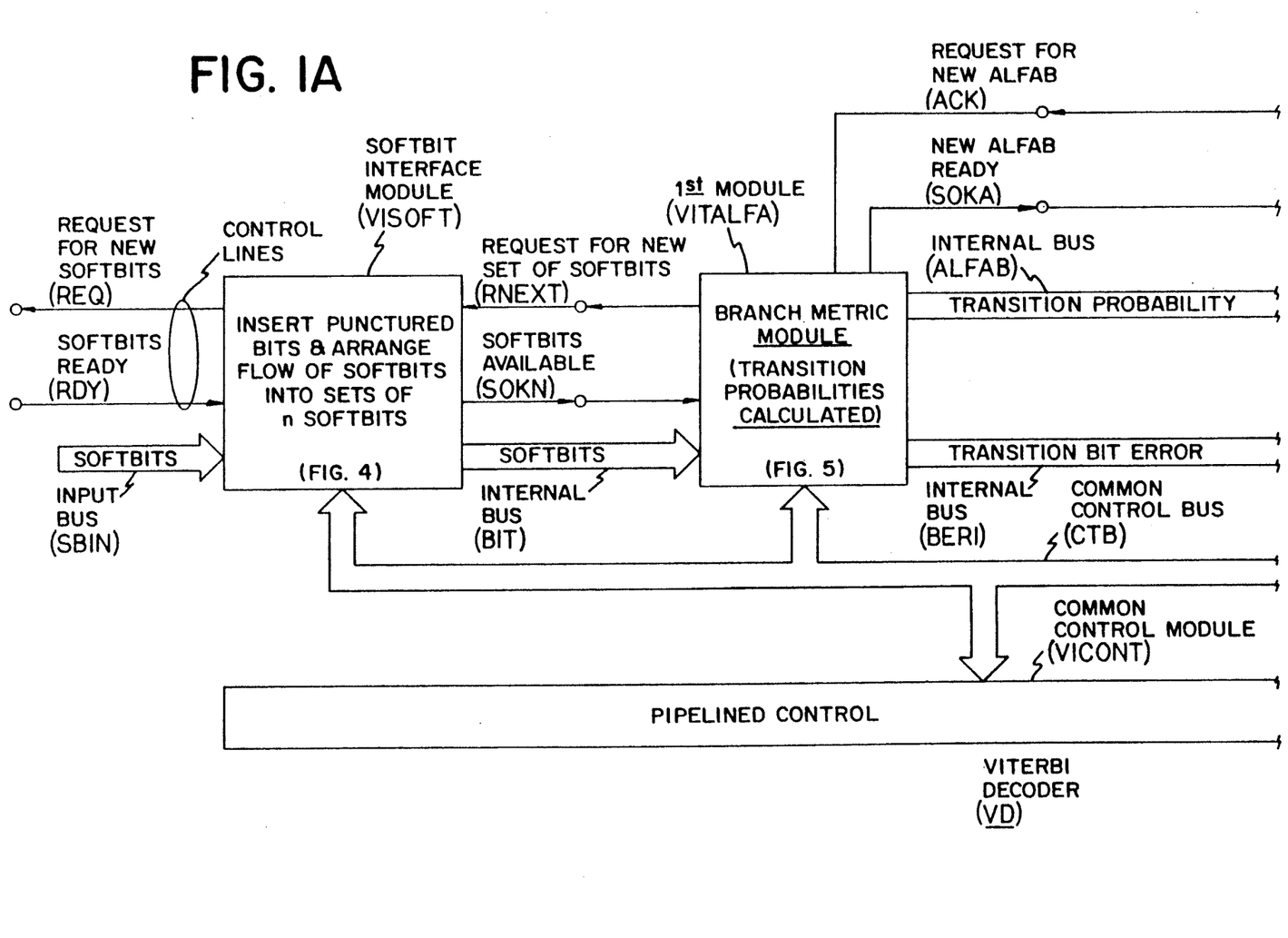
Figure 1B:
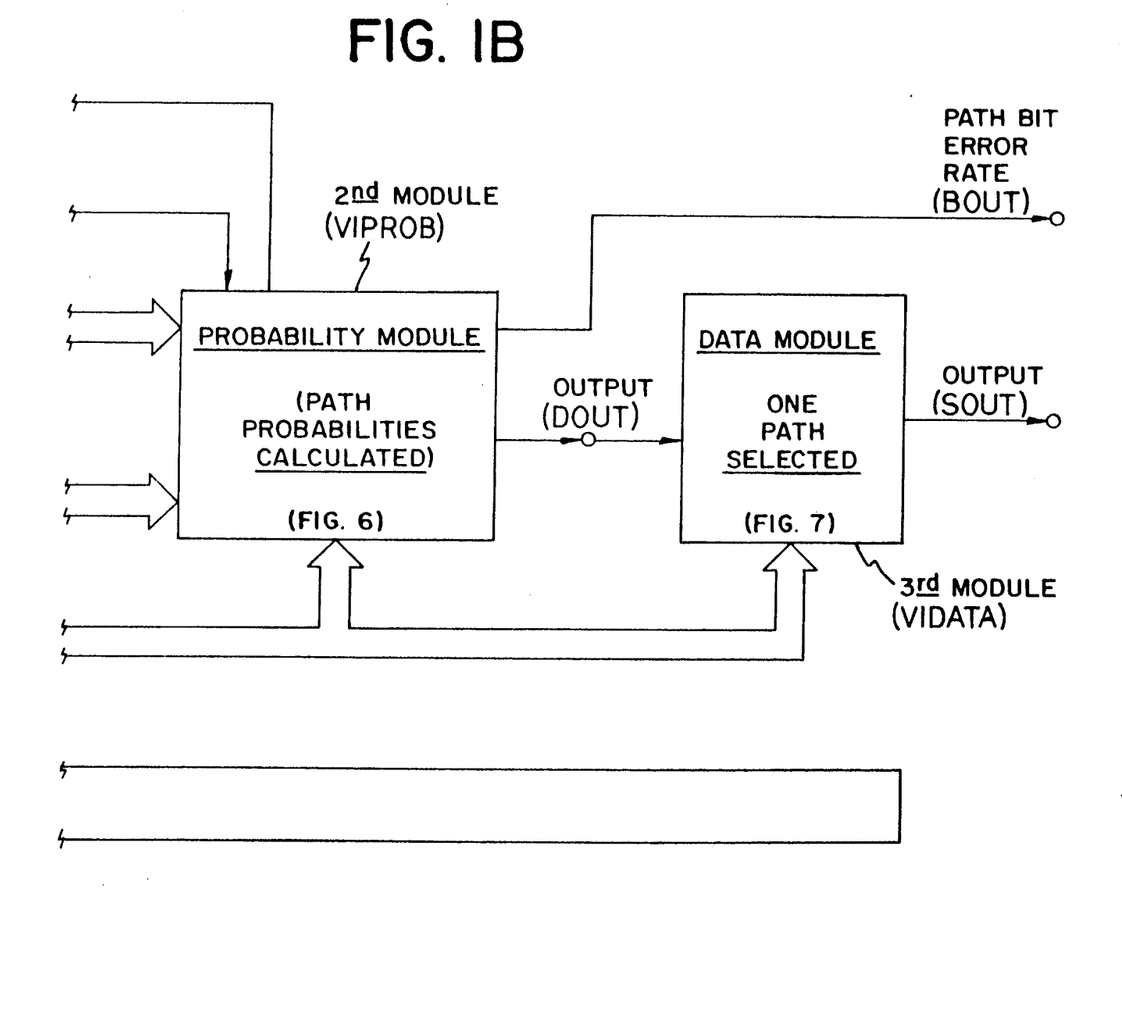

The decoder device VD shown in FIGS. 1A and 1B is a Viterbi decoder integrated in a portion, about a quarter, of a single electronic chip which is included in a receiver of a handportable mobile station of a digital cellular radio system. VD is used for decoding digital messages according to the Viterbi convolutional decoding algorithm which is for instance explained in detail in the book "DIGITAL COMMUNICATION - Fundamentals and Applications" by B.SKLAR, published in 1988 by "Prentice-Hall Internationational, Inc.", and more particularly in Chapter 6 thereof entitled: "Channel Coding - Part 2" (page 314 to 380).

The messages have previously been convolutionally encoded in a transmitter of the digital cellular radio system. In this transmitter the data bits to be transmitted to the receiver are first arranged in distinct input messages or input sequences each having a length of m input data bits, with m being for instance equal to 248.

Figure 2:
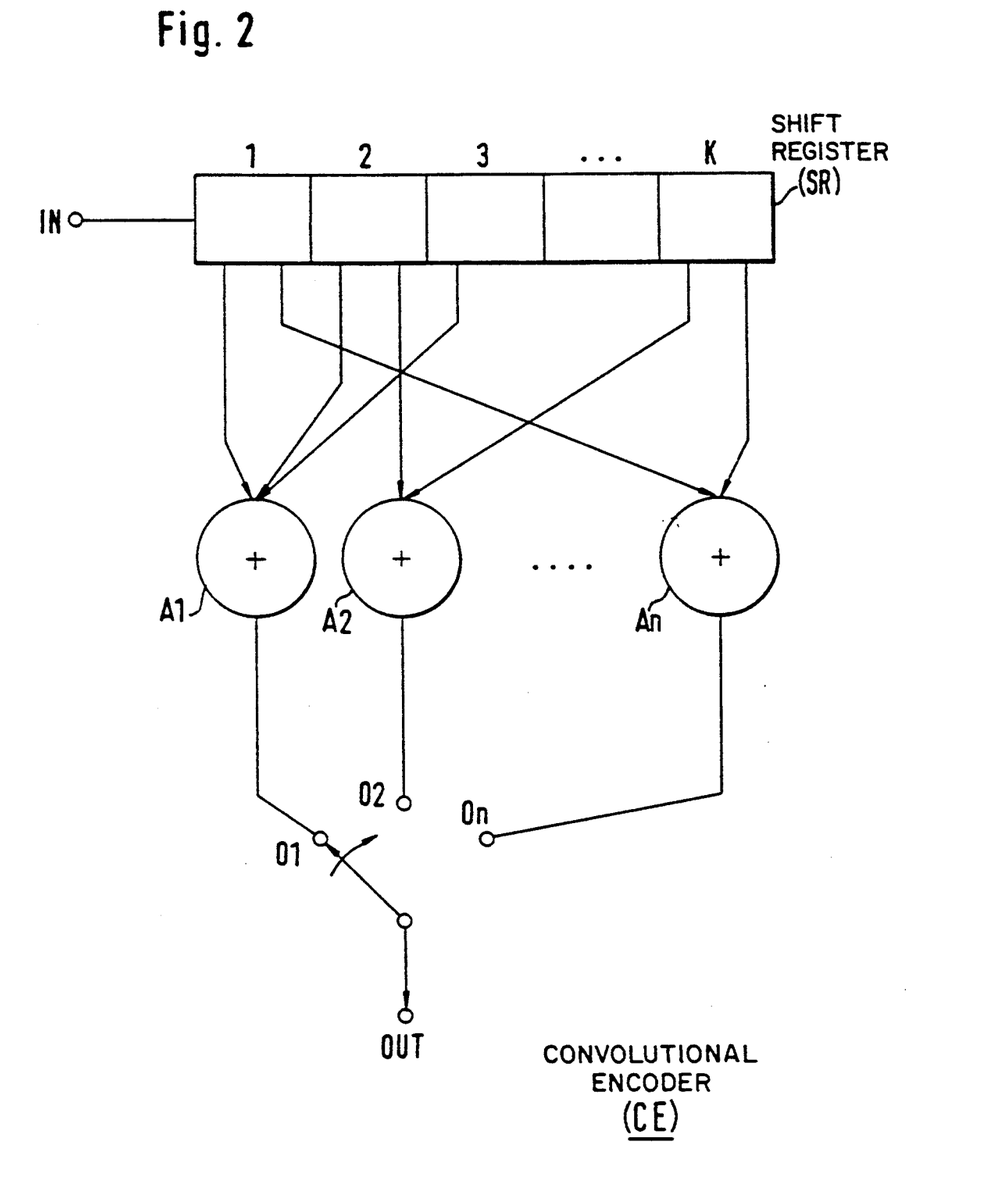
FIG. 2 is a schematic view of a convolutional encoder CE for encoding messages to be decoded by the Viterbi decoder VD of FIG. 1.

These input messages are then encoded in a convolutional encoder forming part of the transmitter, an example of such an encoder CE being schematically represented in FIG. 2. The latter encoder CE is a linear finite state machine constituted by a K-stage shift register SR with input IN and outputs to which are coupled n modulo-2 adders A1, A2, ..., An. The n outputs 01, 02, ..., On of these adders are coupled to an encoder output OUT of CE through a schematically represented sampling switch. K is the so-called "constraint length" which is for instance equal to 5 and represents the number of bit shifts over which one input data bit of an input message can influence the encoder output OUT. At each time moment, one new input data bit is shifted into the register SR, all the bits in this register are shifted over one bit position to the right, and the outputs of the n adders A1 to An are sequentially sampled to yield a codeword of n coded bits at the encoder output OUT, The sequence of m*n coded bits relating to one input message is then used to modulate a waveform to be transmitted, "*" being the multiplication sign, Since there are-n coded bits for each input data bit, the code rate, which is the ratio of the number of coded bits to the number of input data-bits, is equal to n, e.g. 2, 3 or 6.

A state of the encoder CE is defined as the $K-1$ rightmost stages or bit positions of the shift register SR, so that CE has $2(K-1)$ possible states, "" being the exponent sign. The knowledge of an actual state, together with that of the next input data bit of the input message is necessary and sufficient to determine a following state. A transition from an actual state to a following state, i.e. the state at a following time moment, is called "state transition". Only two well defined state transitions, corresponding to the two possible input data bits 0 and 1, can emanate from each state and, consequently, only two well defined state transitions can end in a particular state. Each state transition may be represented either by the next input data bit or by the coded bits obtained with this next input data bit. It can be proved that the coded bits associated to one of the two possible state transitions starting from a state are binary complementary to those associated to the other state transition. The same is true for the coded bits of the two state transitions ending in a state. The repetitivity of this structure has been exploited to represent all the possible state transitions of an encoder in a diagram called "Trellis diagram".

Figure 3:
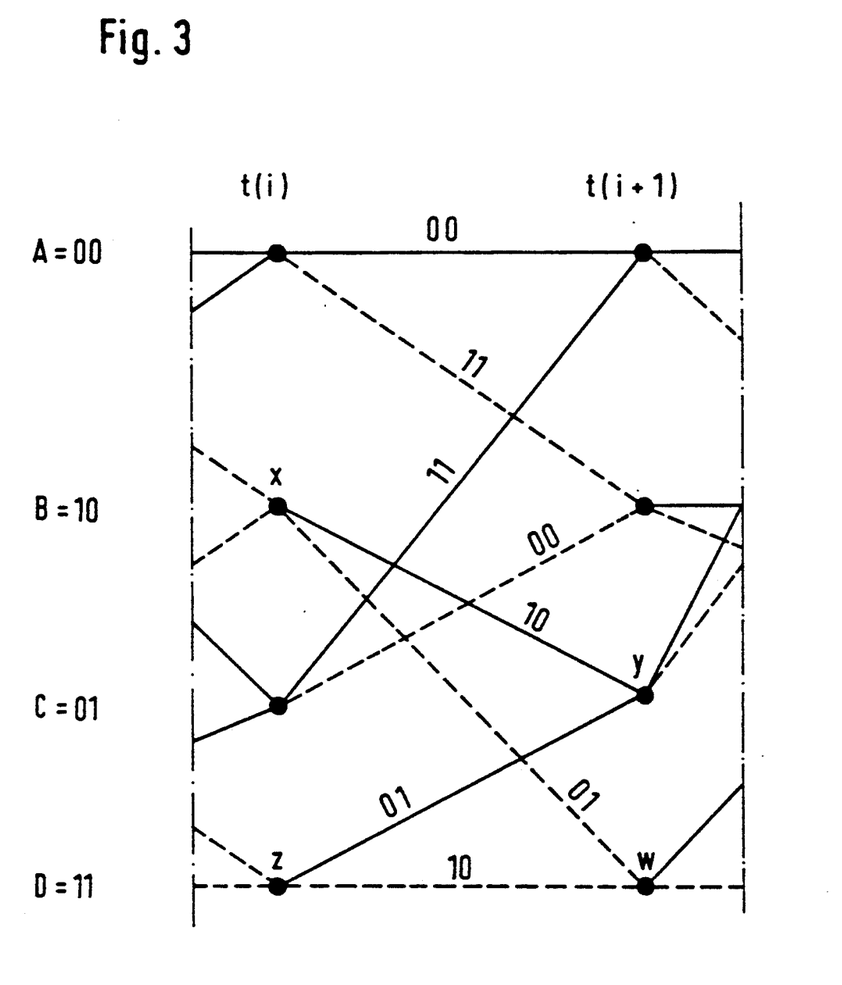
FIG. 3 shows state transitions in a portion of a Trellis diagram used in the Viterbi decoder VD of FIG. 1.

A simplified version of a Trellis diagram, i.e. for a code rate $n=2$ and for a constraint length $K=3$ (and not 5 as in the above example), is partially shown in FIG. 3. In this figure, the $(2**(K-1))=4$ possible states A, B, C and D are represented by distinct dots at a time moment t(i) as well as at the following time moment t(i+1), and the 8 possible state transitions are represented by lines linking the 4 states at t(i) to those at t(i+1). Each state is defined by a binary value, e.g. $A=00$, $B=10$, $C=01$ and $D=11$. Solid lines denote a state transition generated by an input data bit 0, whereas dashed lines denote a state transition generated by an input data bit 1. For instance, starting in the state $B=10$ at the time moment t(i), an input data bit 0 will lead to a state transition ending in the state $C=01$ at the time moment t(i+1), this state transition being represented by the pair of coded bits 1 and 0. On the other hand, a input data bit 1 will then lead to a state transition ending in the state $D=11$ at the time moment t(i+1), this state transition being represented by the pair of coded bits 0 and 1.

From the above it follows that, starting from a predetermined initial state, e.g. B, each input data bit of an input message shifted in the encoder CE corresponds to a well defined state transition so that the whole message of m input data bits may be represented in the Trellis diagram by a path constituted by m consecutive state transitions.

As will be explained in more detail later, the Viterbi decoder VD of FIGS. 1A and 1B tries to recover the input message, which will then be called "estimated message", by extracting this single encoder's path from all the possible paths in the Trellis diagram. This is only possible if the decoder VD stores the encoder's Trellis diagram in a memory called "branch matrix" (SCNT, FIG. 5), e.g. under the form of all the possible or expected state transitions and/or their associated expected (input) data bit or expected coded bits, and if each message ends in a predetermined state, e.g. in the state A. For realizing this last condition, at the encoder side, $(K-1)$ input bits having a binary value 0 and called "flushing bits" are appended to the significant input data bits of each input message, the total length of the message being m. These flushing bits cause the path followed by an input message in the encoder's Trellis diagram to end in the predetermined end state, e.g. A, by clearing the contents of the K-stage shift register SR of CE after each of these input messages.

In case the available transmission bandwidth would be surpassed by the required m*n coded bits of a message, the redundancy generated by the coding algorithm may be slightly decreased to fit exactly this available bandwidth. This redundancy is reduced by removing some coded bits. A coded bit removed from a message is called "punctured bit" and the operation of selectively dropping information, i.e. coded bits, according to a predetermined algorithm is called "puncturing", each possible algorithm corresponding to a puncturing scheme. By a suitable choice of the puncturing scheme and thus of the punctured bits, the transmission quality may remain acceptable notwithstanding the reduced redundancy. The use of a puncturing scheme is thus generally preferred over the use of a lower code rate n because such a rate reduces more drastically the redundancy and thus also the transmission quality. The puncturing technique is already known in the art and is therefore not explained in more detail here.

The receiver (not shown) of a mobile station includes a demodulator and the Viterbi decoder VD shown in FIGS. 1A and 1B.

After having performed a demodulation according to a known demodulation process, the demodulator extracts the 4 most significant bits from 12 bit words resulting from this demodulation process. Each set of such 4 bits is called "softbit". Each softbit is thus a quantized representation of one of the above coded bits of the encoder.

By taking into account the above puncturing scheme, the Viterbi decoder VD first generates correct sets of n softbits.

By means of these softbits and the contents of the branch matrix the Viterbi decoder VD then calculates a most likely path through the Trellis diagram. This calculation is performed in three operation steps, namely a forward pass, a backward pass and an output phase.

During the forward pass, for each received set of n softbits, VD calculates a likelihood value and assigns it to all the possible state transitions between two consecutive time moments, e.g. between $t(i)$ and $t(i+1)$. This calculated likelihood value is called "transition probability value" and is maximum when the softbits correspond exactly to the expected coded bits from the branch matrix for a particular state transition, whereas it is minimum when none of the softbits match with these expected coded bits. Maximum and minimum apply to the case when the n softbits are represented with the maximum absolute value, e.g., the decimal value $(+7)$ for a logical 1 and the decimal value $(-7)$ for a logical 0. In case the absolute values of the softbits are different, the following approach is used: for an expected sequence, e.g. 1/0/1, if one receive s softbits with amplitude $(+5)/(-1)/(+7)$ the transition probability value is calculated as $(+5)*(+1)+(-1)*(-1)+(+7)*(+1)=13$, where the amplitude of each softbit is multiplied by a factor $(+1)$ for a binary data bit i or $(-1)$ for a binary data bit 0, whilst if one receives softbits with amplitude $(+3)/(+5)/(-1)$ the transit ion probability value is calculated as $(+3)*(+1)+(+5)*(-1)+(-1)*(+1)=-3$.

From now on, a transition probability value will be referenced to as ALFA(xy) where x and y are two states such as A, B, C or D shown in FIG. 3, x being the start state and y the end state of a state transition.

VD also calculates path probability values for each of the $2^{}(K-1)$ states. A path probability value is a likelihood value equal to the sum of the state transition probability values assigned to the state transitions forming a possible path through the Trellis diagram and ending in a particular state. At each time moment and for each state only the path probability value having the highest value is selected and stored in a first memory (MEMP, FIG. 6A) of VD. This first memory thus stores $2^{}(K-1)$ most likely path probability values. From now on, a path probability value will be referenced to as PROB(y), where y is an end state of a path.

When one most likely path is selected for a state, the most likely data bit corresponding to the last state transition of that path is stored in a second memory (DMEM, FIG. 7) of VD. This is done at each time moment and for each state so that t he second memory is able to store $m*(2^{}(K-1))$ most likely data bits, i.e. m data bits for each of the $2^{}(K-1)$ most likely messages, each ending in a distinct state.

The forward pass is completed for a message when this second memory is full.

As already mentioned, every input message ends with a fixed number of zero bits, i.e, the $(K-1)$ flushing bits having a binary value 0, as a consequence of which the $2^{**}(K-1)$ most likely paths all converge, in the Trellis diagram, to the predetermined end state $Y=A$.

This feature is exploited during the backward pass, where one estimated message is selected amongst the $2^{**}(K-1)$ most likely messages stored in the second memory. This estimated message corresponds in the Trellis diagram to the path having the highest path probability value and it is reconstructed by following this path, in reverse order, i.e. starting from the predetermined end state A. The estimated data bits of this estimated message are thus collected in reverse order during the backward pass.

Finally, during the output phase, these estimated data bits are put again in the normal order and are serially transmitted to an output SOUT of the Viterbi decoder VD.

Additionally to generate the estimated-message, the present Viterbi decoder VD also provides, on the fly, a so-called "path bit error rate value" BER(y) which is the number of softbits that differ from the coded bits of a message ending in the state y. In more detail, for each selected most likely state transition, referred to as xy for a transition from the start state x to the end state y, the corresponding softbits are compared with the expected coded bits stored in the branch matrix of VD. The result of this comparison is called "transition bit error rate value" TBER(xy) and is equal to the number of softbits which are different (in sign) from the coded bits. For each selected most likely path ending in a state y, BER(y) is equal to the sum of the transition bit error rate values of all the state transitions of that path. For each of the $2^{**}(K-1)$ states, one path bit error rate value is stored in a third memory (MEMB, FIG. 6A) of VD. This third memory is associated to the above first memory (MEMP, FIG. 6A) which stores the most likely path probability values for the same state. The path bit error rate value BER(y) of this message is provided at an output BOUT of the Viterbi decoder VD.

The Viterbi decoder VD shown in FIGS. 1A and 1B will be described below first generally and then in more detail by making reference to the FIGS. 4 to 7.

VD has a 4-segment domino architecture comprising the blocks VISOFT, VITALFA, VIPROB and VIDATA all controlled in common by a control module VICONT. The first four blocks, i.e. the softbit interface module VISOFT, the branch matrix calculation module VITALFA, the probability module VIPROB and the .data module VIDATA are all used for the forward pass, whilst only VIDATA is also used for the backward pass and for the output phase.

From the above demodulator of the receiver and via an input bus SBIN, VISOFT receives softbits and transmits them to VITALFA after having taken into account a possible puncturing scheme as described above. The transmission between VISOFT and VITALFA is performed via an internal bus BIT. VISOFT is also connected to the preceding demodulator by two control lines REQ and RDY. Through REQ VISOFT requests new softbits from this demodulator and via RDY the latter demodulator indicates that the requested softbits are available on the input bus SBIN. Similar control lines RNEXT and SOKN are present between VISOFT and VITALFA. Through RNEXT VITALFA requests a new set of n softbits from VISOFT and via SOKN VISOFT communicates to VITALFA that these softbits are available on the bus BIT. Finally, general control signals and configuration information, e.g. the message length m, the code rate n and the puncturing scheme, are provided by the common control module VICONT to VISOFT as well as to VITALFA, VIPROB and VIDATA via an internal common control bus CTB linking all these blocks.

VITALFA then calculates, for every possible state transition in the Trellis diagram, the transition probability values ALFA(xy) of these state transitions in function of the n received softbits. As already mentioned, the transition probability values ALFA(xy) are calculated by comparing the n received softbits with the n expected coded bits for a same state transition, these expected coded bits being stored in the branch matrix (SCNT, FIG. 5) which is located in VITALFA. The thus calculated transition probability values ALFA(xy) are then transmitted to VIPROB via an internal bus ALFAB.

Simultaneously with the calculation of the most likely transition probability values ALFA(xy), VITALFA also calculates a corresponding transition bit error rate value TBER(xy) which is supplied to VIPROB via an internal bus BERI.

VIPROB then calculates a new set of most likely path probability values PROB(y), namely one for each (end) state y, from a previous set of path probability values stored in the above first memory (MEMP, FIG. 6A) which is located in VIPROB and from the transition probability values ALFA(xy) provided by VITALFA. For each end state y, the selected or new most likely path probability value PROB(y) is equal to the highest value amongst the sums of the previous most likely path probability values PROB(x) stored in the first memory and the transition probability value ALFA(xy) for each start state x. When, for an end state y, a most likely path through the Trellis diagram is thus established by VIPROB, a most likely data bit is derived from the last most likely state transition of this path. This most likely data bit is then transmitted to VIDATA via a terminal DOUT.

Simultaneously with the calculation of a most likely path probability value PROB(y), and therefore with the selection of a path and more particularly of the last most likely state transition ALFA(xy) of that path, VIPROB calculates a corresponding path bit error rate value BER(y) which is the sum of the transition bit error rate values TBER(xy) of all the state transitions xy constituting the selected path. To this end, VIPROB includes the above third memory (MEMB, FIG. 6A) wherein one most likely path bit error rate value BER(y) is stored for each end state y. As for the calculation of a new PROB(y), a new BER(y) is equal to the sum of a previous BER(x) stored in the third memory and TBER(xy) supplied by VITALFA via the bus BERI. However, for the calculation of BER(y) no selection is made amongst $2^{**}(K-1)$ values because BER(x) and TBER(xy) are imposed by and correspond to the last state transition of the most likely path already selected by VIPROB.

VITALFA and VIPROB are further interconnected by two control lines ACK and SOKA. Through ACK VIPROB requests a new transition probability value ALFA(xy) and a new transition bit error rate value TBER(xy) from VITALFA and through SOKA VITALFA communicates to VIPROB that these values are available on the busses ALFAB and BERI.

VIDATA, which receives most likely data bits from VIPROB via the terminal DOUT, includes the above second memory (DMEM, FIG. 7) able to store $m*2^{}(K-1)$ most likely data bits, i.e. the $2^{}(K-1)$ most likely messages, with one message for each end state. Due to the above flushing bits, one knows that the estimated message, i.e. the only one remaining most likely message which will be provided at the output SOUT of the Viterbi decoder VD, ends in the state y=A. The contents of the second memory is so arranged that VIDATA is able to extract the (estimated) data bits of the estimated message starting from this known end state A. These data bits, thus collected in reverse order, are temporarily stored again in the second memory, but now in predetermined other locations thereof. When all the estimated data bits of the estimated message are selected by VIDATA, the latter serially outputs these estimated data bits, in the correct order, to the output SOUT.

The operation of the four main blocks of VD will be described in more detail hereafter by making reference to the FIGS. 4 to 7.

Figure 4:
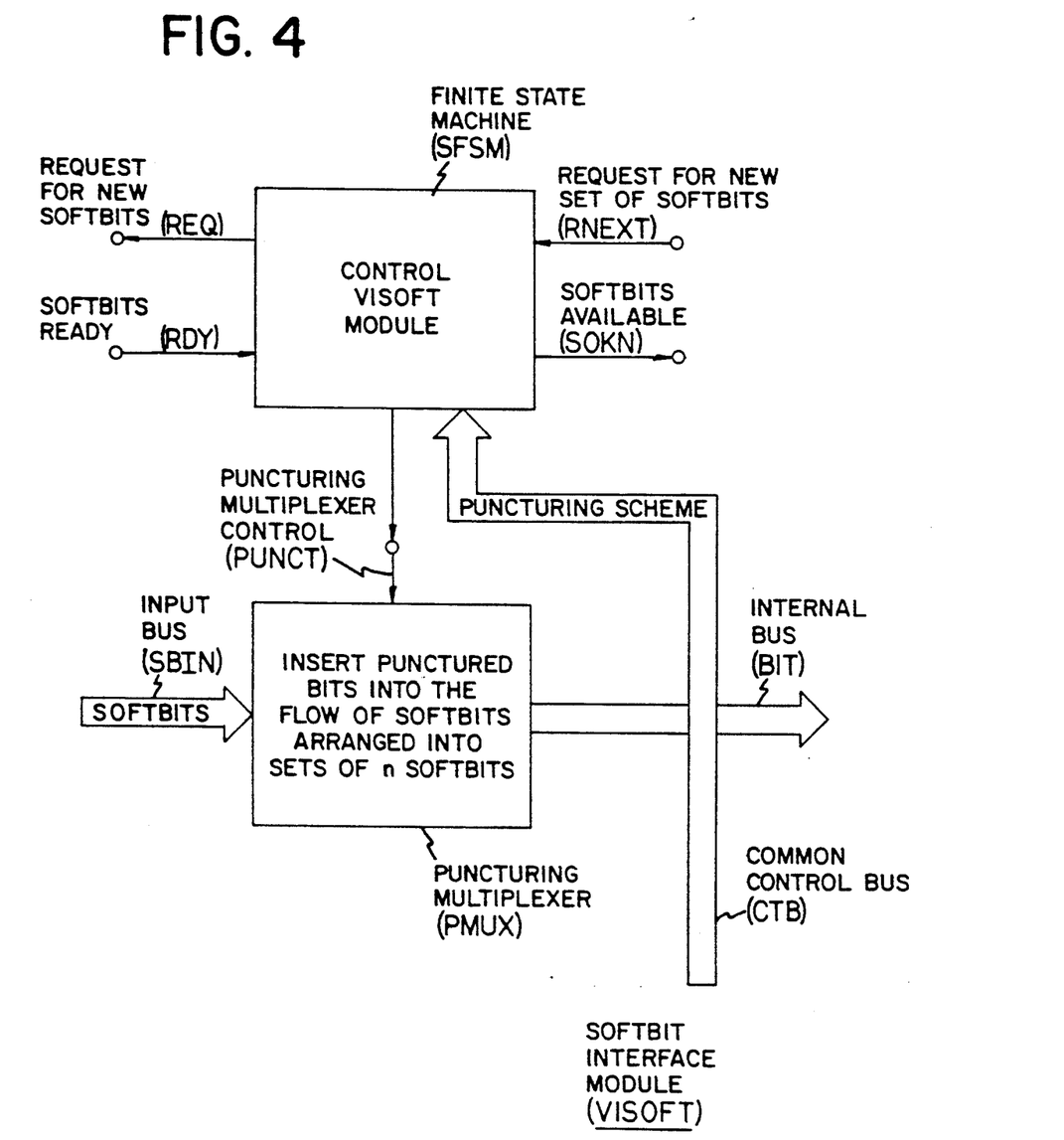
FIG. 4 shows the "softbit" interface module VISOFT of FIG. 1 in more detail.

FIG. 4 shows the softbit interface module VISOFT in more detail. VISOFT includes a control circuit or finite state machine SFSM to which the control lines REQ, RDY, RNEXT and SOKN are connected as well as the control bus CTB. SFSM is the so-called "local intelligence" of VISOFT and controls, via a terminal PUNCT, a puncturing multiplexer PMUX also included in VISOFT. The input of PMUX is the input bus SBIN and its output is the internal bus BIT.

The purpose of PMUX is to insert punctured bits into the flow of softbits received via SBIN. Via the terminal PUNCT SFSM controls the operation of PMUX according to a puncturing scheme received from VICONT via the control bus CTB. PMUX then arranges the flow of bits into sets of n softbits each. Upon request of VITALFA via the control line RNEXT PMUX loads a set of n softbits on the bus BIT and activates the signal on the control link SOKN.

Figure 5:
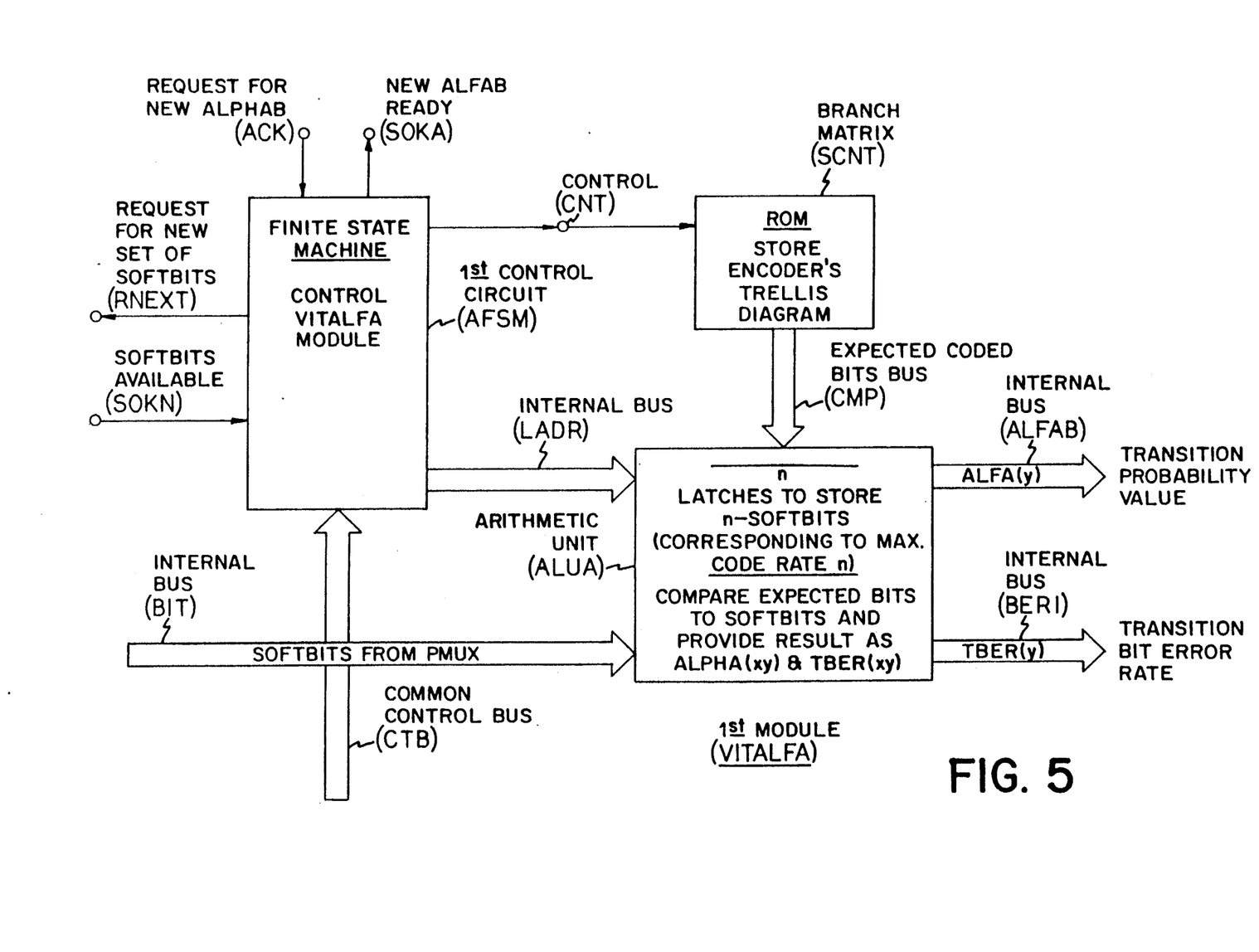
FIG. 5 represents the branch metric calculation module VITALFA of FIG. 1 in more detail.

The module VITALFA, shown in FIG. 5, then receives in its arithmetic unit ALUA the set of n softbits from VISOFT. ALUA contains six latches able to store up to six softbits. This corresponds to the maximum code rate n mentioned above. VITALFA also includes a control circuit or finite state machine AFSM to which the control bus CTB of VICONT is connected as well as the control lines RNEXT, SOKN, ACK and SOKA. This local intelligence AFSM of VITALFA controls ALUA via an internal bus LADR, and controls the above branch matrix SCNT via a terminal CNT, this matrix SCNT being connected to ALUA via a bus CMP. The outputs of the arithmetic unit ALUA are connected to VIPROB via the busses ALFAB and BERI.

The branch matrix SCNT is a ROM memory wherein, as already mentioned, are stored all the possible state transitions of the encoder's Trellis diagram under the form of expected coded bits and/or expected data bits. Under the control of AFSM, ALUA compares, for all the state transitions ending in a state y, the expected coded bits received from SCNT via the bus CMP with the softbits received from VISOFT via the bus BIT. The results of these comparisons are the above transition probability value ALFA(xy) and the transition bit error rate value TBER(xy) which are calculated by the arithmetic unit ALUA as explained above by means of an example and which are simultaneously loaded on the busses ALFAB and BERI respectively.

In a preferred embodiment and since the transition probability values of state transition ending in a particular state y are both equal in absolute value and only differ in sign, only this absolute value, called "ALFA(y)", will be transmitted from VITALFA to VI- PROB via the bus ALFAB. Similarly, the transmission bit error rate values are binary complementary so that it is sufficient to transfer only one of them to VIPROB as BER(y) via the bus BERI.

Figure 6:
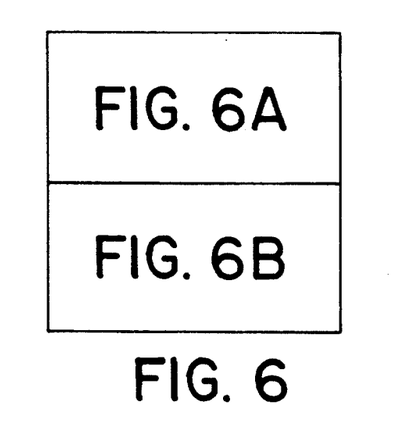
FIG. 6 shows the relation between FIGS. 6A and 6B which together show the probability module VIPROB of FIG. 1 in more detail.
Figure 6A:
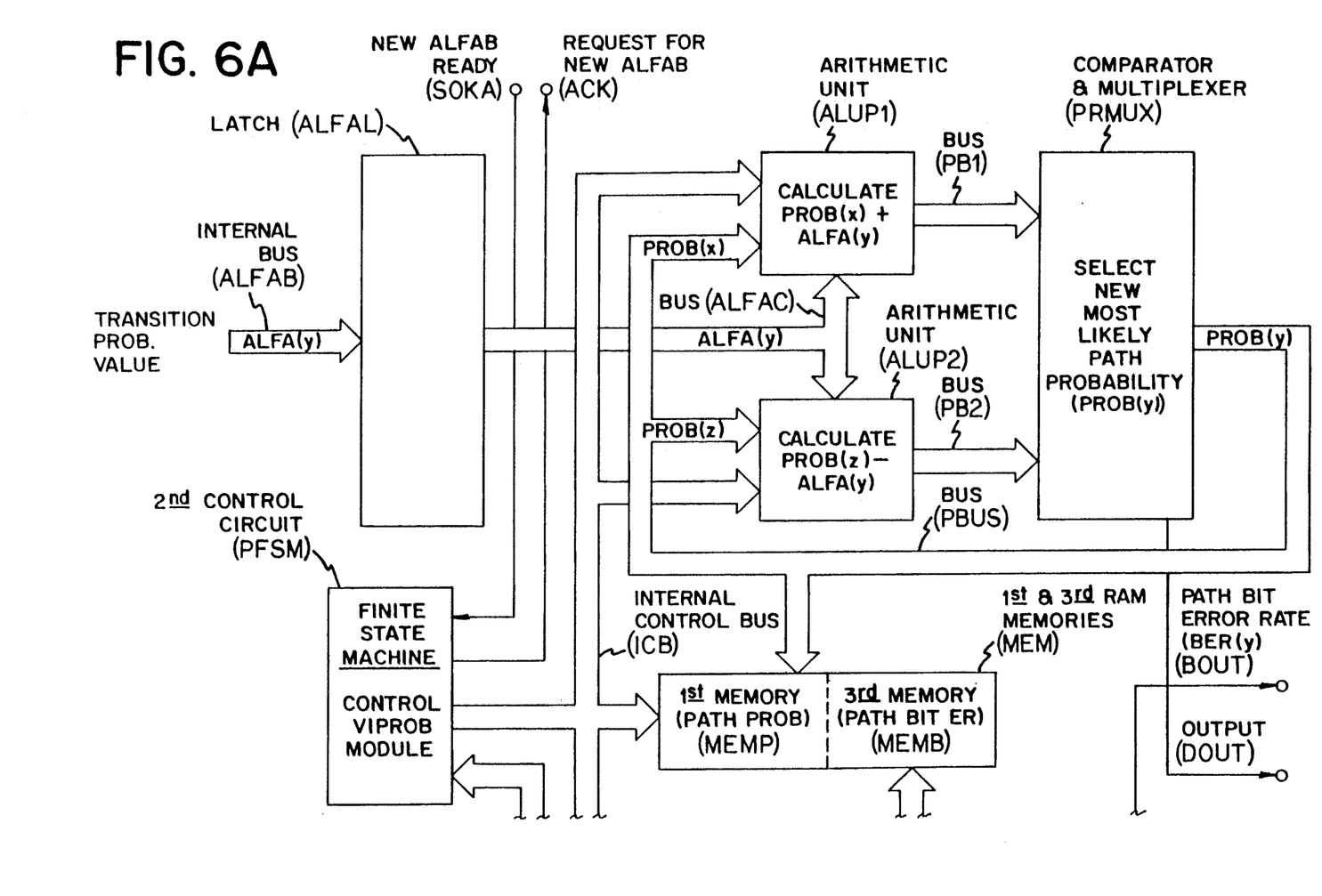
Figure 6B:
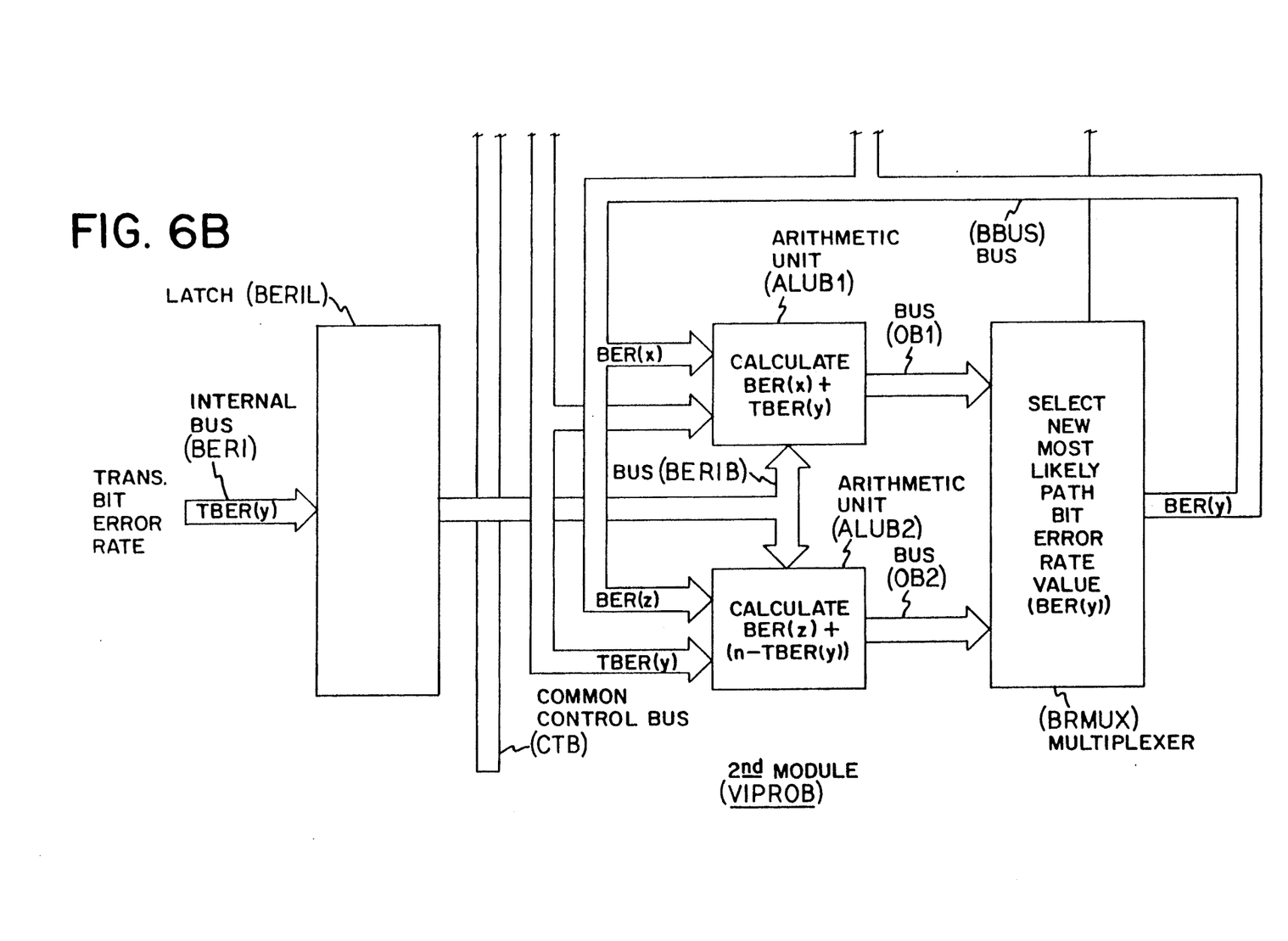

In VIPROB, shown in FIGS. 6A and 6B, new most likely path probability values are calculated for each end state. For instance, a new most likely path probability value PROB(y) for ending in the state y starting from the state x or z is the highest value amongst PROB(x)+ALFA(y) and PROB(z)−ALFA(y), wherein PROB(x) and PROB(z) are read from the first memory HEMP and ALFA(y) is received via the bus ALFAB.

It is to be noted that the Trellis diagram of which a portion is shown in FIG. 3 may be subdivided into a number of closed system called "butterflies". One butterfly is for instance the system comprising the states B and D at the moment t(i) and the states C and D and the moment t(i+1), these states will now be referred to as x, z, y and w respectively. It can be seen that the calculation of one complete butterfly, resulting in new path probability values (PROB) for the states y and w, is based on the same input values, i.e. PROB(x), PROB(z) and ALFA(y) (or ALFA(w)). The following equations hold:

If PROB(x)+ALFA(xy)>PROB(z)+ALFA(zy)

then PROB(y)=PROB(x)+ALFA(xy)

else PROB(y)=PROB(z)+ALFA(zy)

and

If PROB(x)+ALFA(xw)>PROB(z)+ALFA(zw)

then PROB(w)=PROB(x)+ALFA(xw)

else PROB(w)=PROB(z)+ALFA(zw)

Since ALFA(xy)=−ALFA(zy)

and ALFA(xy)=−ALFA(xw)

and ALFA(xw)=−ALFA(zw), one can derive therefrom that ALFA(xy)=ALFA(zw) or, according to the above notation, that ALFA(y)=ALFA(w), which may also be referred to as ALFA(y/w).

Because there are $2^{}(K-1-1)$ butterflies for each state transition, VIPROB calculates $2^{}(K-2)$ sets of path probability values (PROB) for two end states each.

Simultaneously, new most likely path- bit error rate values BE R(y), BER(w) are calculated as BER(x)+TBER(y) or BER(z)+(n−TBER(y)) and BER(x)+TBER(w) or BER(z)+(n−TBER(w)), where n is the above code rate, depending on the new most likely path probability values PROB(y) and PROB(w) selected as described above. BER(x) and BER(z) are read from the third memory MEMB whilst TBER(y) and TBER(w) are received in VIPROB via the bus BERI. In more detail, VIPROB is made up of two similar blocks (top and bottom of the joined together FIGS. 6A and 6B), namely one for handling the path probabilities values and the other for processing the path bit error rate values. The (top) probability block of VIPROB includes:

- a latch ALFAL for receiving the transition probability values ALFA(y) from the bus ALFAB;
- two arithmetic units ALUP1 and ALUP2 for simultaneously calculating the new path probability values PROB(x)+ALFA(y) and PROB(z)−ALFA(y) from previous path probability values PROB(x) and PROB(z) stored in the memory HEMP and received therein via a bus PBUS and from the value ALFA(y) received in these arithmetic units from the latch ALFAL via a bus ALFAC; and
- a comparator and multiplexer PRMUX to which both ALUP1 and ALUP2 are connected via respective busses PB1 and PB2 and of which the output is connected to the memory MEMP via the bus PBUS, PRMUX selecting the new most likely path probability PROB(y) amongst the two values received from ALUP1 and ALUP2, as explained above.

It is to be noted that the first memory MEMP and the third memory MEMB are associated and form together one RAM memory HEM which has a capacity of $2^{**}(K-1)$ words of 20 bits each. The path probability part MEMP of MEM stores words of 12 bits, whilst the path bit error rate part MEMB of MEM stores words of 8 bits and is connected to the (bottom) bit error rate block of VIPROB described below.

Like the (top) probability block, the (bottom) bit error rate block includes:

- a latch BERIL for receiving the transition bit error rate values TBER(y) from the bus BERI;
- two arithmetic units ALUB1 and ALUB2 for simultaneously calculating the new path bit error rate values BER(x)+TBER(y) and BER(z)+(n−TBER(y)) from previous path bit error rate values BER(x) and BER(z) stored in the memory MEMB and received therein via a bus BBUS and from the transition bit error rate values TBER(y) received from the latch BERIL via a bus BERIB; and
- a multiplexer BRMUX to which both ALUB1 and ALUB2 are connected via respective busses OB1 and OB2 and of which the output is connected to the memory MEMB via the bus BBUS, BRMUX selecting the new most likely path bit error rate value BER(y) amongst the two values received from ALUB1 and ALUB2 as explained above, i.e. according to the selection made by PRMUX.

The comparator and multiplexer PRMUX further has an output connected to the terminal DOUT and through which the most likely data bit corresponding to the last most likely transition probability value of the path selected by PRMUX, i.e. the path having the highest path probability value, is transmitted to the data module VIDATA. Similarly, the multiplexer BRMUX also has an output connected to the output terminal BOUT of the Viterbi decoder VD and at which the most likely path bit error rate value BER(y) of the selected most likely path is available.

Finally, VIPROB includes a control circuit or finite state machine PFSM which is the local intelligence of VIPROB and to which the control bus CTB and the above control lines ACK and SOKA are connected. PFSM controls the arithmetic units ALUP1, ALUP2, ALUB1 and ALUB2 as well as the RAM memory MEM via a common internal control bus ICB.

When a new most likely path probability value PROB(y) is selected by PRMUX, say for instance the output of ALUP1, this new value PROB(y) is written in MEMP, the corresponding last most likely data bit 0 or 1 is transmitted to DOUT and BRMUX selects the arithmetic unit ALUB1 which is associated to ALUP1. The bit error rate value BER(y) at the output of ALUB1 is then written in MEMB via the bus BBUS and transmitted to the terminal BOUT.

All these operations are successively performed for the $2^{**}(K-1)$ states for each of which only one most likely path through the Trellis diagram is thus selected, the other possible path(s) being systematically eliminated by VIPROB.

Figure 7:
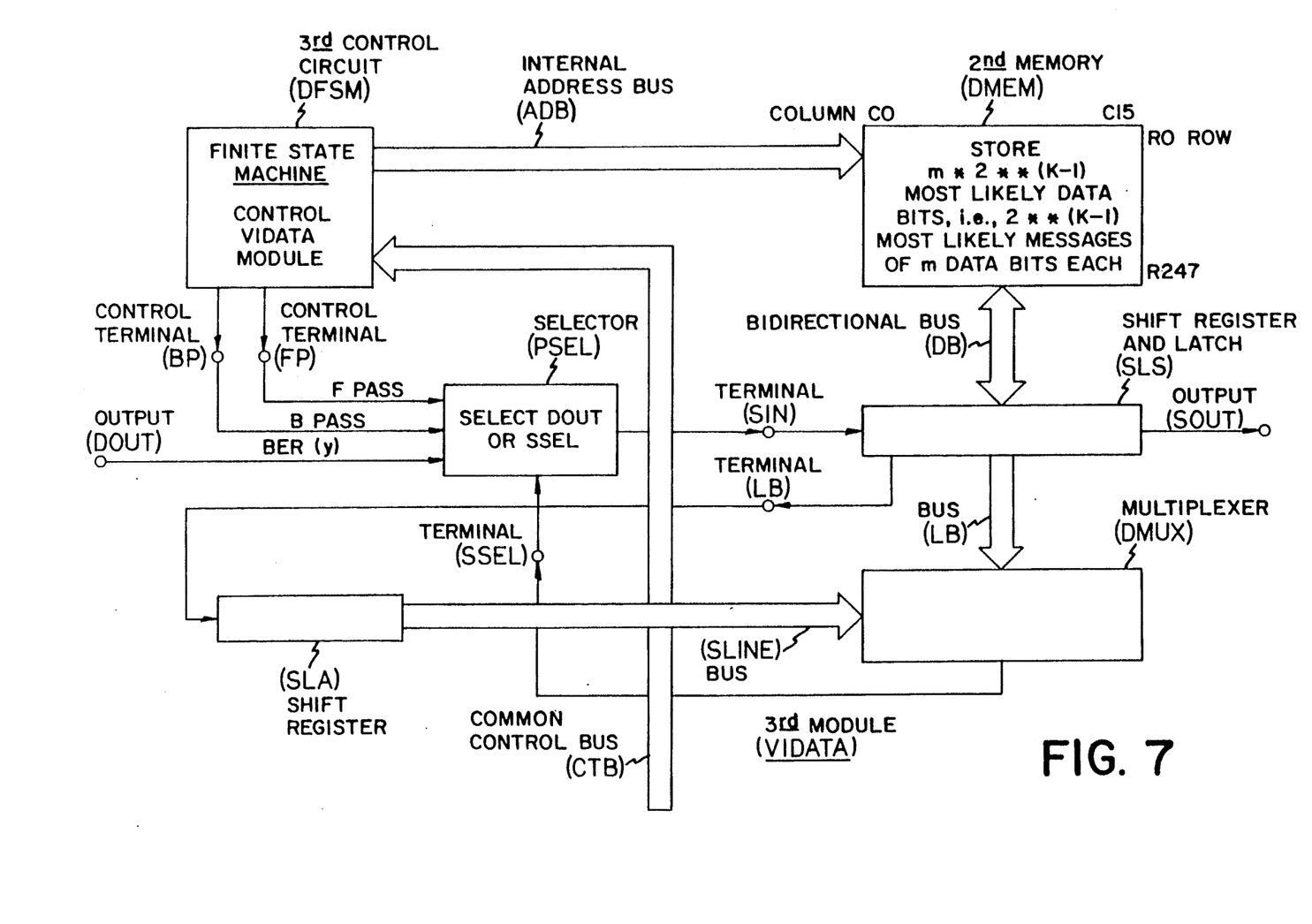
FIG. 7 represents the data module VIDATA of FIG. 1 in more detail.

As already mentioned, each time a path is selected by VIPROB, the most likely data bit corresponding to the last state transition of that path is transmitted via DOUT to VIDATA (shown in FIG. 7). This means that for each message to be decoded, VIDATA receives $mx2^{**}(K-1)$ data bits, with m being the above message length and K the constraint length.

In order to extract only one estimated message from all these data bits, VIDATA includes:

the above second memory DMEM able to store $2^{**}(K-1)$ most likely messages of m data bits each;
a $2^{**}(K-1)$ shiftregister and latch SLS for latching one set of most likely data bits;
a $2^{**}(K-1)$ - to - 1 bit multiplexer DMUX;
a $K-1$ bit shiftregister SLA for addressing DMUX;
a selector PSEL for transferring to SLS the data bit at the terminal DOUT or at the output of DMUX; and
a control circuit or finite state machine DFSM for synchronizing the operations of VIDATA under the supervision of VICONT.

In the following part of the text, the constraint length K is supposed to be equal to 5 and the length m of the estimated message is equal to 248.

The finite state machine or local intelligence DFSM receives control information from VICONT via the bus CTB and controls the operation of DMEM via an internal address bus ADB as well as the operation of PSEL via two control terminals FP and BP. DFSM indicates via FP and BP that the forward pass or the backward pass is running respectively.

During the forward pass, the most likely data bits of the last state transition of the paths selected by VIPROB for the $2^{**}(K-1)=16$ states are successively supplied to VIDATA via the terminal DOUT. Since a control signal FP at the like named control terminal of DFSM is then activated, PSEL serially transfers these data bits to SLS via a terminal SIN. When a 16 bit word constituted by 16 most likely data bits, one for each end state, is assembled in the shift register and latch SLS, DFSM controls the transfer of this word into a predetermined row of the memory DMEM. This transfer is performed via a bidirectional 16 bit bus DB and each 16 bit word coming from SLS is stored in a distinct row of the m=248 rows or word locations of DMEM, starting from the top row RO.

When 248 words of 16 most likely data bits have been stored in the rows RO to R247 of DMEM, the forward pass is completed.

The following process handles the data stored in DMEM in reverse order, i.e. from the last word received in SLS and thus stored in row R247 to the first word stored in row RO, and is therefore called "backward pass", as mentioned above. During this backward pass, a control signal BP at the like named control output of DFSM is activated. This signal BP inhibits data bits to be transferred, through PSEL, from DOUT to SLS but allows the transfer of data bits from DMUX to SLS via a terminal SSEL, PSEL and SIN, the terminal SSEL linking DMUX and PSEL.

The extraction of an estimated message from the memory DMEM is based on a feature of Trellis diagram according to which the binary value of an end state y is given by the binary value of the start state x shifted of 1 bit position to the right and whereto the data bit of the state transition xy is appended (on the left).

In more detail, to extract the last estimated data bit of the estimated message the address pointer of the memory DMEM is first set, by DFSM, on the last row R247 thereof, i.e. on the row which stores the last word received during the forward pass, whilst the 4-bit shift register SLA is initialized to 0, 0, 0, 0, i.e. to select the first bit on the left in the multiplexer DMUX. As a result, and because the multiplexer DMUX receives its 16-bit word input data from the memory DMEM via a bus LB, the data bit located in position R247/CO, where CO indicates the first column on the left of DMEM, is selected and provided at the output of DMUX. From there, this last estimated data bit is transferred to the shift register and latch SLS via the terminal SSEL, the selector PSEL and the terminal SIN. This last estimated data bit, which is then located in the most left position of the shift register and latch SLS, is shifted in the 4 bit shift register SLA via a terminal LB linking this most left position of SLS to a serial input of SLA, This data bit is also copied into the location R247/CO of the memory DMEM via the bus DB. The reason of this copy is that during this backward pass the estimated message will be constructed bit by bit in the first column CO of the memory DMEM, the last estimated data bit being in the row R247 and the first one in the row RO.

It is to be noted that the location R247/CO is selected for extracting the last estimated data bit, i.e. to start the backward pass, because of the above mentioned flushing bits appended to each message and which make the most likely path through the Trellis diagram to converge to a predetermined end state. In the present case, this is the state corresponding to the column CO of the memory DMEM, i.e, the state A having the binary value 00.

To extract the penultimate estimated data bit of the estimated message, the row R246 (not shown) of DMEM is selected by DFSM and the column address of this bit is given by the actual contents of SLA. As a result, the row R246 of DMEM is applied to the input of DMUX and one data bit thereof, selected by SLA, is copied in the most left position of SLS via SSEL, PSEL and SIN. From there, this penultimate estimated data bit is shifted in SLA via LB and is copied into the location R246/CO of the memory DMEM.

Each estimated data bit is so extracted from DMEM and recopied in the first column CO thereof. When the m=248 rows of DMEM have been handled, the last row handled being RO, the backward pass is completed.

During the following output phase, the m estimated data bits are read from the memory DMEM and serially applied to the output DOUT of Viterbi decoder VD. To this end, the column CO of DMEM is read from row RO to row R247 and the estimated message is transmitted to DOUT in the correct order via the bus DB and the shiftregister and latch SLS.

Since every task of the Viterbi algorithm is performed by distinct blocks or modules VISOFT, VITALFA, VIPROB and VIDATA of VD, each having a local intelligence SFSM, AFDM, PSFM and DFSM respectively and since these blocks repeat a same subroutine for every set of bits received therein, these different tasks can be pipelined under control of the common control module VICONT and through the local intelligence of every block. This pipelining means for instance that, once the branch metric module VITALFA has calculated the transition probability values ALFA(y) and the transition bit error rate values TBER(y) for all the 2(K−1) states and has transmitted these values to VIPROB, a new set of n softbits may be provided from VISOFT by which VITALFA restarts its calculations. Further, while this following calculation of ALFA(y) and of TBER(y) is performed by VITALFA, VIPROB updates both the path probability part MEMP and the path bit error rate part MEMB of its RAM memory MEM with the calculated values PROB(y) and BER(y) and transfers 2(k−1) most likely data bits to VIDATA. .VIDATA then updates its memory DMEM until the latter is full and starts then the backward pass which will be followed by the output phase.

As already mentioned, the timing of all these activities is supervised by VICONT via the common control bus CTB through which VICONT has access to the different local intelligences of VD. Each of these local intelligences SFSM, AFSM, PFSM and DFSM then controls the local operations of the block or module to which it belongs and returns control information to the common control module VICONT, e.g. when a task is completed.

It is finally to be noted that, since the coding principle uses the history, over the constraint length K, of the encoding message constituted by a stream of input data bits, the Viterbi decoder VD is able to correct bursty transmission errors based on the above maximum likelihood decoding algorithm as long as the bursts of errors are shorter than this constraint length K.

While the principles of the invention have been described above in connection with specific apparatus, it is to be clearly understood that this description is made only by way of example and not as a limitation on the scope of the invention.

We claim:

1. Decoder device using the Viterbi algorithm for decoding convolutionally encoded messages, comprising: a first module (VITALFA) for calculating transition probabilities for possible state transitions between two successive states of the decoder, and a second module (VIPROB) for calculating, as a function of said transition probabilities, path probabilities for possible paths constituted by successive state transitions and ending in each of said states, and for selecting, for each of said states, only a path having the highest path probability value, wherein said first module (VITALFA) is for further calculating, for each of said transitions, a transition bit error rate which is a function of a difference between bits (softbits) received in said first module (VITALFA) and the bits (coded bits) expected for a same state transition.

2. Decoder device according to claim 1, wherein said first module (VITALFA) includes a first control circuit (AFSM) for controlling said first module, and that said second module (VIPROB) includes a second control circuit (PFSM) for controlling said second module.

3. Decoder device according to claim 2, wherein said first module (VITALFA) and said second module (VIPROB) operate independently from each other, their operation for being supervised by a common control module (VICONT).

4. Decoder device according to claim 1, wherein it includes a third module (VIDATA) for selecting. amongst said paths selected by said second module (VIPROB), only one path corresponding to an estimated message to be decoded.

5. Decoder device according to claim 4, wherein said third module (VIDATA) includes a third control circuit (DFSM) for controlling said third module, and that said third module (VIDATA) is for operating independently from said first (VITALFA) and said second (VIPROB) modules, all these modules for being supervised by a common control module (VICONT).

6. Decoder device according to claim 1, wherein said first module (VITALFA) is for simultaneously calculating, for each state transition, said transition probability and said transition bit error rate.

7. Decoder device according to claim 1, wherein said second module (VIPROB) is for further calculating, for the path selected for each state, a path bit error rate which is a sum of said transition bit error rate calculated for each of said transitions.

8. Decoder device according to claim 7, wherein said second module (VIPROB) is for calculating, simultaneously and in parallel, said path probability and said path bit error rate.

9. Decoder device according to claim 4, wherein said first (VITALFA), second (VIPROB) and third (VIDATA) modules are connected in cascade.

10. Decoder device according to claim 1, wherein it is implemented as one functional block if an integrated circuit.

* * * * *

UNITED STATES PATENT AND TRADEMARK OFFICE
CERTIFICATE OF CORRECTION

PATENT NO. : 5,331,665
DATED : July 19, 1994
INVENTOR(S) : Busschaert et al

It is certified that error appears in the above-indentified patent and that said Letters Patent is hereby corrected as shown below:

Column 14, claim 4, line 2, after "selecting", please change the period to a comma; and Column 14, claim 7, line 5, please insert --state-- prior to "transitions".

Signed and Sealed this

Twenty-seventh Day of September, 1994

Attest:

BRUCE LEHMAN

Attesting Officer     Commissioner of Patents and Trademarks